(12) United States Patent
Yamada et al.

(10) Patent No.: US 9,799,527 B2
(45) Date of Patent: Oct. 24, 2017

(54) DOUBLE TRENCH ISOLATION

(71) Applicant: SANDISK TECHNOLOGIES LLC, Plano, TX (US)

(72) Inventors: Katsuo Yamada, Yokkaichi (JP); Yuji Takahashi, Yokkaichi (JP); Takuya Futase, Yokkaichi (JP); Noritaka Fukuo, Yokkaichi (JP); Tomoyasu Kakegawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/519,740

(22) Filed: Oct. 21, 2014

(65) Prior Publication Data
US 2016/0111493 A1    Apr. 21, 2016

(51) Int. Cl.
| | |
|---|---|
| *H01L 29/06* | (2006.01) |
| *H01L 21/308* | (2006.01) |
| *H01L 27/11521* | (2017.01) |
| *H01L 21/762* | (2006.01) |
| *H01L 21/28* | (2006.01) |
| *H01L 21/02* | (2006.01) |

(52) U.S. Cl.
CPC .... *H01L 21/3083* (2013.01); *H01L 21/76224* (2013.01); *H01L 27/11521* (2013.01); *H01L 21/02255* (2013.01); *H01L 21/28273* (2013.01)

(58) Field of Classification Search
None
See application file for complete search history.

(56) References Cited

U.S. PATENT DOCUMENTS

| | | | |
|---|---|---|---|
| 5,614,271 A | 3/1997 | Shibuya et al. | |
| 7,416,987 B2* | 8/2008 | Hieda | H01L 21/02164 257/E21.17 |
| 7,615,445 B2 | 11/2009 | Chien et al. | |
| 8,106,475 B2* | 1/2012 | Kitamura | H01L 21/76224 257/510 |
| 8,154,102 B2* | 4/2012 | Matsuda | C23C 16/308 257/510 |
| 8,546,888 B2* | 10/2013 | Bian | H01L 21/76232 257/374 |
| 8,603,890 B2 | 12/2013 | Purayath et al. | |
| 8,658,284 B2* | 2/2014 | Chen | C08G 77/62 427/58 |
| 2005/0258463 A1* | 11/2005 | Yaegashi | H01L 27/115 257/296 |
| 2008/0003739 A1* | 1/2008 | Lee | H01L 21/76224 438/221 |
| 2008/0003773 A1* | 1/2008 | Kwak | H01L 21/76224 438/425 |

(Continued)

OTHER PUBLICATIONS

Cross, et al., "Fabrication Process for Ultra High Aspect Ratio Ploysilazane-Derived MEMS," IEEE, 2002, pp. 172-175.

*Primary Examiner* — Abul Kalam
(74) *Attorney, Agent, or Firm* — Foley & Lardner LLP

(57) ABSTRACT

Isolation is provided by forming a first trench, depositing a cover layer on the bottom and sidewalls of the first trench, selectively removing the cover layer from the bottom and forming a second trench extending from the bottom of the first trench. The second trench is then substantially filled by thermal oxide formed by oxidation and the first trench is subsequently filled with a deposited dielectric.

10 Claims, 7 Drawing Sheets

(56) References Cited

U.S. PATENT DOCUMENTS

| | | | |
|---|---|---|---|
| 2008/0132016 A1* | 6/2008 | Lee | H01L 27/115 438/264 |
| 2008/0242044 A1* | 10/2008 | Hong | H01L 21/76232 438/435 |
| 2008/0251883 A1* | 10/2008 | Kitamura | H01L 21/76224 257/513 |
| 2009/0155978 A1 | 6/2009 | Yeh et al. | |
| 2009/0170282 A1* | 7/2009 | Dong | H01L 21/76232 438/435 |
| 2010/0078757 A1* | 4/2010 | Eun | H01L 21/76232 257/506 |
| 2010/0148301 A1* | 6/2010 | Matsuda | C23C 16/308 257/510 |
| 2011/0241096 A1* | 10/2011 | Bian | H01L 21/76232 257/316 |
| 2012/0214006 A1 | 8/2012 | Chen et al. | |
| 2012/0264268 A1* | 10/2012 | Lee | H01L 21/76224 438/289 |
| 2015/0014807 A1* | 1/2015 | Chuang | H01L 29/0649 257/506 |

\* cited by examiner

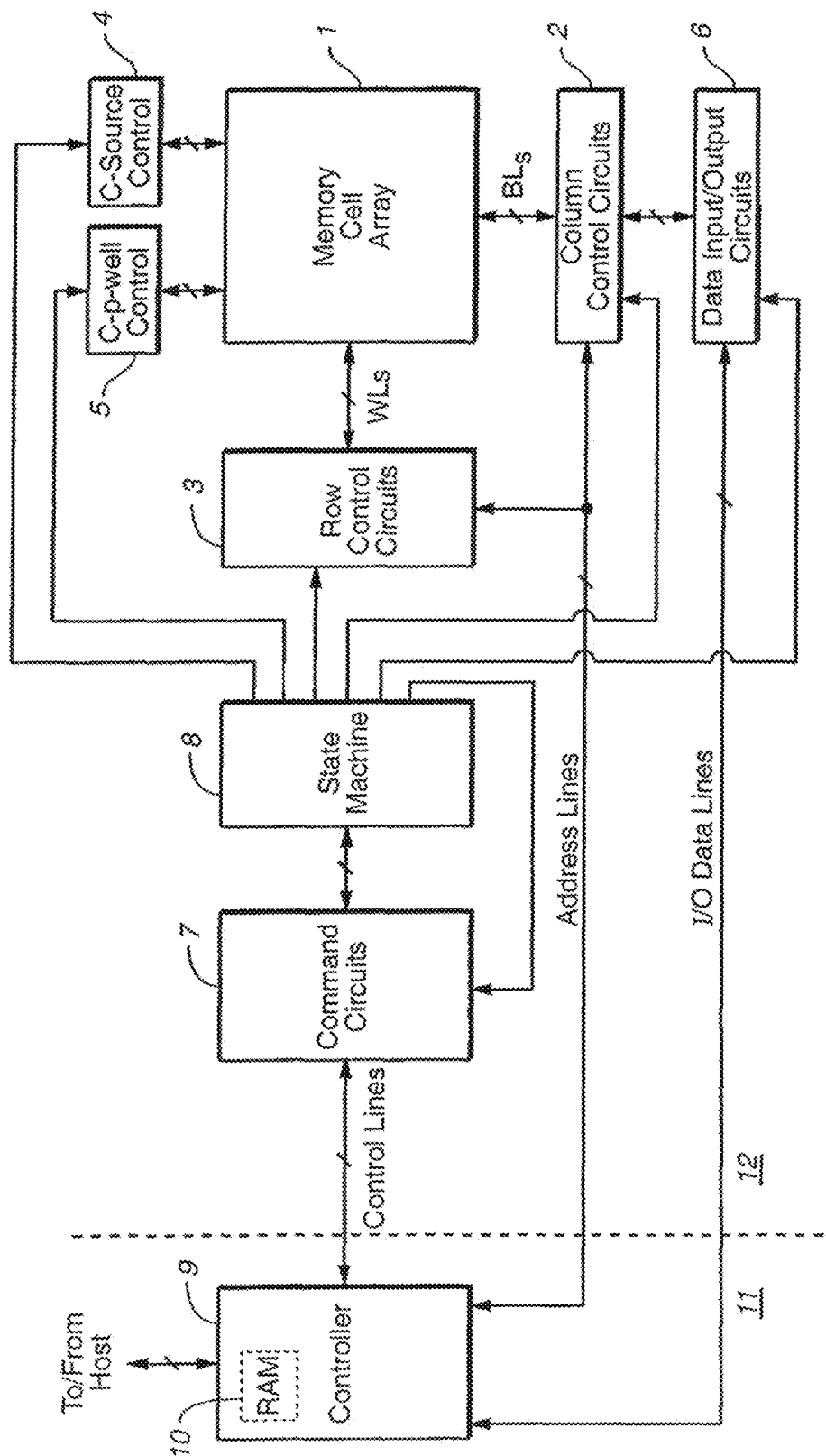
FIG._1
(Prior Art)

(Section A-A)

FIG. 2C (Prior Art)
(Section B-B)
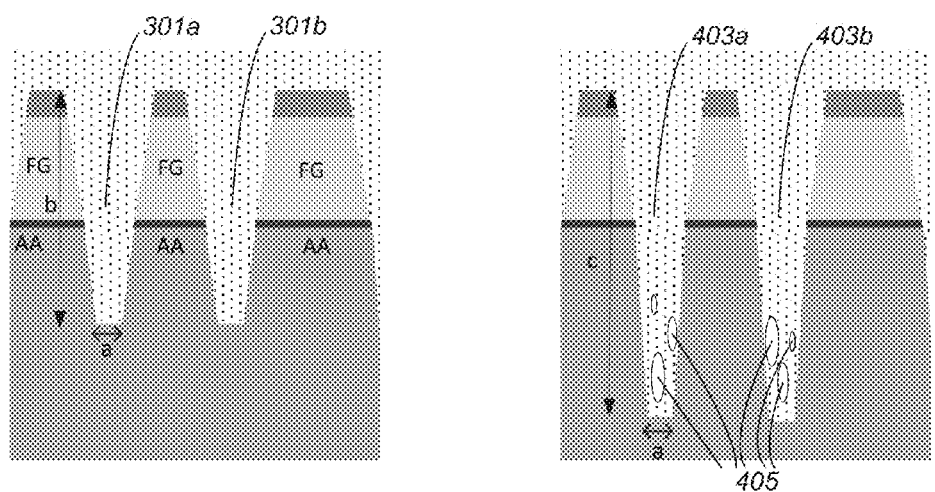
FIG. 3  FIG. 4

DOUBLE TRENCH ISOLATION

BACKGROUND

This specification relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Isolation is provided between neighboring NAND strings to reduce coupling between strings and reduce current leakage. Isolation may extend between contact areas also. Shallow Trench Isolation (STI) is one form of isolation that may be used to isolate NAND strings. Good isolation may allow improved operation of an integrated circuit such as a NAND flash memory and may reduce power consumption.

Thus, there is a need for isolation structures that provide good isolation between adjacent structures and for manufacturing processes that form such isolation structures in an efficient manner.

SUMMARY

According to an example of formation of a memory integrated circuit, high aspect ratio isolation trenches are formed having a double trench structure that provides void free filling even when aspect ratios are high (e.g. higher than an upper limit for void free filling of a single trench structure). A first set of trenches may be formed having a first aspect ratio (low enough to allow void free filling) and the surfaces of the first trenches may be covered with one or more layers. The covering layers may then be removed from bottom surfaces of the first trenches to expose underlying silicon (e.g. by anisotropic etching) while leaving sidewalls covered. The bottom surfaces may then be selectively etched by using an etch chemistry that is selective to silicon thereby forming second trenches. The aspect ratio of the combined first and second trenches may exceed an upper limit for void free filling. Oxidation is then used to selectively fill the second trenches (where silicon is exposed) while maintaining the first trenches (where silicon is covered) substantially unaffected. Covering layers may be removed and first trenches filled by deposition of suitable material (e.g. polysiliazane). Thus, an isolation trench structure may be formed without voids to a depth that is greater than an upper limit for void free filling by conventional deposition alone.

An example of a method of forming a Shallow Trench Isolation structures includes: forming a first trench on a substrate by anisotropic etching; depositing a first layer on a bottom and a sidewall of the first trench; selectively removing the first layer at the bottom of the first trench by anisotropic etching, while the first layer on the sidewall of the first trench is maintained; subsequently, forming a second trench at the bottom of the first trench by anisotropic etching, while using the first layer as a mask, the second trench extending downward from the bottom of the first trench; selectively subjecting the second trench to thermal oxidation by using the first layer as a mask, whereby the sidewall of the first trench is not oxidized, and the second trench is substantially filled by a thermal oxide; subsequently, removing the first layer by selective isotropic etching with an etching rate of the first layer that is higher than an etching rate of the thermal oxide; and subsequently, substantially filling the first trench with a deposited dielectric.

The first layer may be formed of silicon nitride (SiN) and the selective isotropic etching may be performed using a wet etch process. The wet etch process may use hot phosphoric acid (H3PO4) to etch silicon nitride at a higher rate than the thermal oxide. The first trench may have a first aspect ratio that provides substantially void free filling with the deposited dielectric and a combination of the first trench and the second trench may have a second aspect ratio that is higher than the first aspect ratio and is higher than an upper limit for substantially void free filling with the deposited dielectric.

The bottom of the first trench may form a substantially flat surface that extends from the sidewall to an opposing sidewall; the second trench may be formed with an upper opening that occupies the bottom of the first trench from the sidewall to the opposing sidewall; and subsequent to thermal oxidation, the second trench may have a maximum width that is greater than the distance from the sidewall to the opposing sidewall.

The bottom of the first trench may form a concave surface between the sidewall and an opposing sidewall; the second trench may be formed with an upper opening that occupies a center portion of the bottom; and subsequent to thermal oxidation, the second trench may have a maximum width that is less than the distance from the sidewall to the opposing sidewall. A second layer that is formed of silicon oxide may be deposited on the bottom and sidewall of the first trench before the deposition of the first layer. The process may also include: prior to forming the first trench, forming a gate dielectric layer and a gate polysilicon layer on the substrate; patterning the gate polysilicon layer; and forming the first trench using the patterned gate polysilicon layer as a mask such that the first trench extends through the gate dielectric layer and into the substrate. The dielectric may be polysilazane (PSZ).

An example of a method of forming isolating trenches includes: forming a first trench in a silicon substrate; subsequently, covering sidewalls of the first trench with a cover layer and leaving a bottom surface of the first trench exposed; subsequently, extending a second trench down through the bottom surface of the first trench; subsequently, substantially filling the second trench with silicon oxide that is grown on exposed silicon surfaces of the second trench; and subsequently, substantially filling the first trench with a deposited dielectric.

After substantially filling the second trench and prior to substantially filling the first trench, the cover layer may be removed. The cover layer may be deposited on all surfaces of the first trench and subsequently selectively removed from the bottom surface of the first trench by anisotropic etching to expose the bottom surface of the first trench. Depositing the cover layer may include depositing a layer of silicon oxide and subsequently depositing a layer of silicon nitride. The second trench may be formed by anisotropic etching while the cover layer protects the sidewalls of the first trench. The sidewalls of the first trench may be covered with the cover layer during the filling of the second trench with silicon oxide that is grown on exposed silicon surfaces of the second trench so that no silicon oxide is grown on the sidewalls of the first trench. The deposited dielectric may be polysilazane (PSZ).

An example of an isolating structure in a nonvolatile memory includes: a first trench that extends into a silicon substrate between active areas; a second trench that extends from the first trench further into the silicon substrate; a portion of polysilazane filling the first trench; and a portion of silicon dioxide filling the second trench.

The combined first and second trenches may have an aspect ratio that is greater than an upper limit for depositing substantially void-free polysilazane. The first trench may have an aspect ratio that is less than the upper limit for depositing substantially void-free polysilaze and the portion of polysilazane is substantially void-free. A silicon oxide layer may extend along sides of the first trench. The isolating structure may provide isolation between NAND strings of a NAND flash memory array. The portion of polysilazane may extend above a level of an upper surface of the silicon substrate between floating gates of the nonvolatile memory.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2C shows another cross section of the NAND array of FIG. 2A.

FIG. 3 illustrates an example of trenches with void free filling.
FIG. 4 illustrates an example of trenches with voids.

DETAILED DESCRIPTION OF EXEMPLARY EMBODIMENTS

Memory System

Figure 2A:
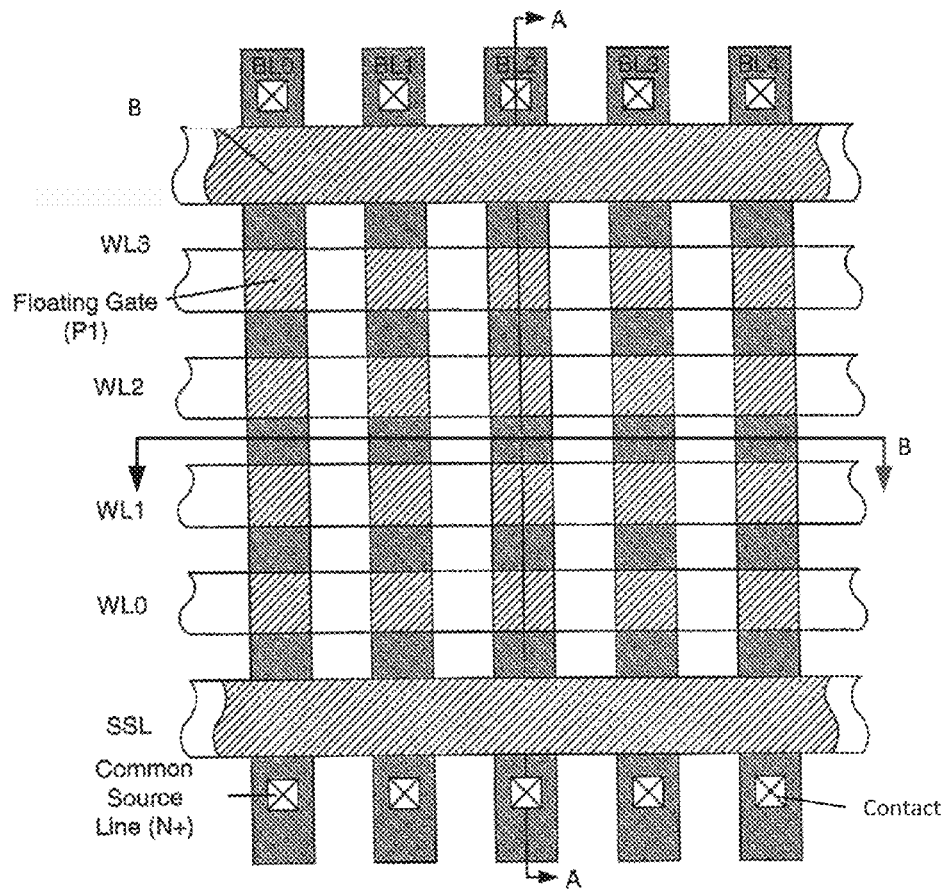
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Examples of memory arrays are not limited to the two dimensional and three dimensional exemplary structures described here and may include various arrangements of memory cells using various physical phenomena to store data.

An example of a prior art memory system, which may be formed using various techniques described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2B:
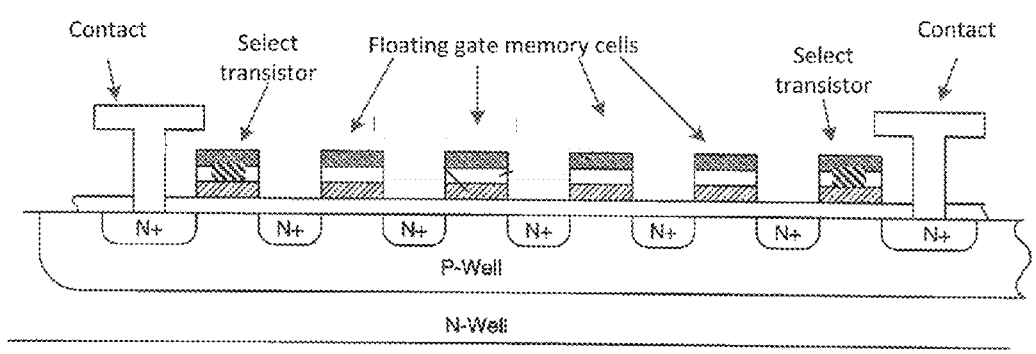
FIG. 2B shows a cross section of the NAND array of FIG. 2A.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). FIG. 2C shows a cross section along B-B of FIG. 2A. This view shows active areas ("AA") in the substrate with STI regions located between active areas of different strings to electrically isolate an individual NAND string from its neighbors. In general, as dimensions get smaller coupling between components increases and isolation becomes more difficult. For example, coupling between neighboring NAND strings may increase with decreasing pitch (decreasing STI width).

Various isolation structures may be used between NAND strings. FIG. 3 shows an example in which isolation trenches 301a-b extend between neighboring active areas ("AA") and floating gates ("FG"). Such trenches may be filled with an appropriate dielectric material that has good dielectric properties and adequately fills trenches. An example of such a material is polysilazane (PSZ). FIG. 3 shows trenches having an aspect ratio of b/a that allows void free filling of trenches 301a-b with PSZ. In general, deeper trenches provide better isolation (less coupling) between NAND strings and it may be desirable to form deep trenches for enhanced isolation.

One problem that may occur when trying to fill deep trenches is that voids may be formed in the filling material. FIG. 4 shows an example of trenches 403a-b that have an aspect ratio of c/a (greater than b/a). These trenches have voids 405 formed because of the high aspect ratio. While various process parameters may be adjusted to reduce voids, there is generally a limit to the aspect ratio of trenches that may be filled without voids for a given material. For example, for some PSZ processes the upper limit for void free filling is an aspect ratio of about 7, while other materials and other processes may have different upper limits, which may be less than seven, e.g. 6, 5, 4, or less, or may be greater than seven, e.g. 8, 9, 10 or more. Voids are generally undesirable because they result in poor and/or non-uniform isolation between NAND strings.

According to an example presented here, a double trench process is used to extend a first trench (that may be finable without voids) by adding a second trench that extends deeper (e.g. beyond a limit for void-free filling). Selective oxidation is then used to fill the second trench while sides of the first trench remain covered to prevent oxidation in the first trench. With the second trench filled with silicon oxide, the first trench can be filled without voids by a deposited dielectric. An example of process steps that may be used in a double trench process are illustrated in FIGS. 5-11.

Figure 5:
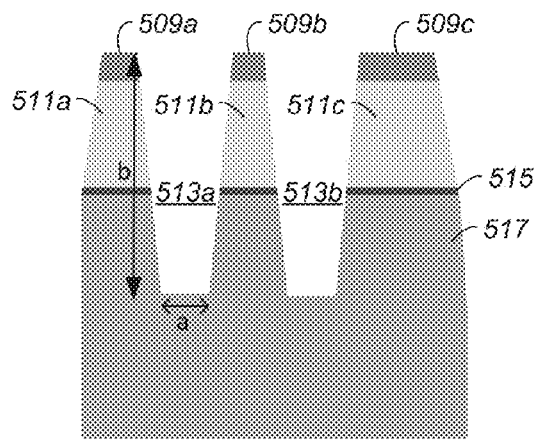
FIG. 5 illustrates first trenches.

FIG. 5 shows an example of first trenches with an aspect ratio of b/a that is below an upper limit for filling with a deposited dielectric material (e.g. PSZ). The trenches may be formed in any suitable manner. Hard mask layer portions 509a-c (e.g. silicon nitride) define floating gates 511a-c and trenches 513a-b. A gate dielectric (gate oxide) 515 underlies the floating gates and separates floating gates from the silicon substrate 517. A hard mask layer may be patterned into portions 509a-c in a conventional manner (e.g. photolithography) and one or more anisotropic etch steps (e.g. Reactive Ion Etching, "RIE") may then use the patterned hard mask to form the trenches through floating gate polysilicon, gate dielectric, and into the underlying silicon substrate.

Figure 6:
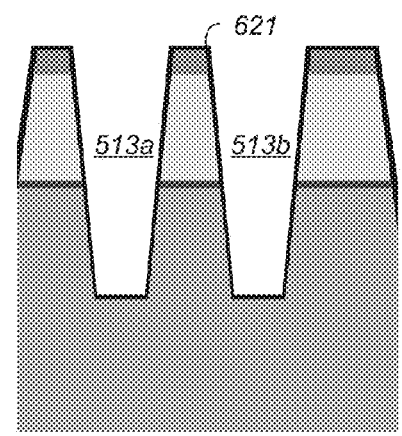
FIG. 6 illustrates deposition of a silicon oxide layer on surfaces of the first trenches.

FIG. 6 shows the structure of FIG. 5 after formation of a liner layer 621. Liner layer 621 extends alongside and bottom surfaces of trenches 513a-b. The liner layer 621 may be silicon oxide (e.g. silicon dioxide) deposited by Chemical Vapor Deposition (CVD) or any suitable technique and may be deposited to a suitable thickness, e.g. three nanometers (3 nm). Liner layer 621 may reduce stress in the finished structure. In some cases, no liner layer may be used and this layer may be considered as optional.

Figure 7:
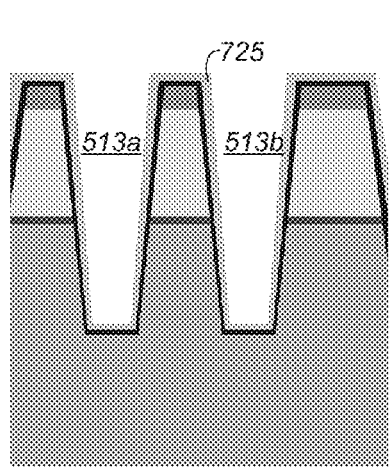
FIG. 7 illustrates deposition of a silicon nitride layer on surfaces of the first trenches.

FIG. 7 shows the structure of FIG. 6 after deposition of a cover layer 725. Cover layer 725 may be formed of silicon nitride formed by CVD or any suitable technique. A cover layer generally serves to cover sides of trenches and may be formed of any material that is suitable for providing protection during subsequent anisotropic etching and oxidation. A cover layer may be deposited to a suitable thickness, e.g. three nanometers (3 nm).

Figure 8:
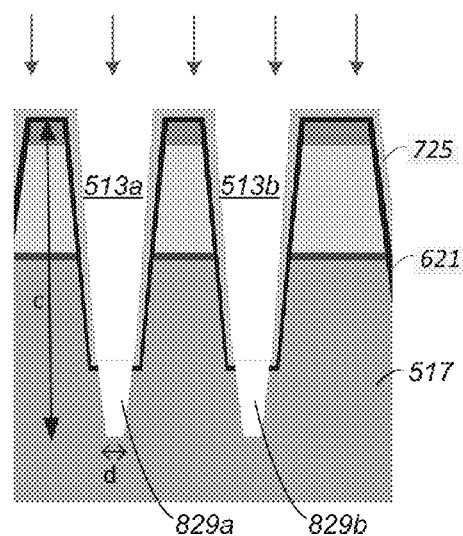
FIG. 8 illustrates anisotropic etching to form second trenches below first trenches.

FIG. 8 shows anisotropic etching that removes cover layer 725 and liner layer 621 from the bottom surfaces of trenches 513a-b while cover layer 725 and liner layer 621 remain in place on sides of trenches 513a-b to protect sides of trenches from etching. Etching continues into the substrate 517 to form second trenches 829a-b in the substrate. Different anisotropic etch steps (e.g. RIE) may be used, e.g. different etch parameters to etch cover layer 725, liner layer 621, and silicon substrate 517. Alternatively a single etch step may be used to etch all three materials. Second trenches 829a-c extends from the bottom surfaces of first trenches 513a-b. In the example of FIG. 8 the combination of the first and second trenches extends to a depth c so that that the combined first and second trenches have an aspect ratio of c/d (i.e. second trenches 829a-b have depth=c−b and a width at the bottom=d). The combined aspect ratio c/d may exceed a limit for void free filling so that depositing a suitable filling material such as PSZ at this stage would result in voids (as shown in FIG. 4).

In FIG. 8, silicon of substrate 517 is exposed along surfaces of second trenches 829a-b while covering layer 725 covers surfaces of first trenches 513a-b. This provides a difference that allows selective filling of second trenches 829*a-b* without filling, or depositing significant filling material in the first trenches 513*a-b*.

Figure 9:
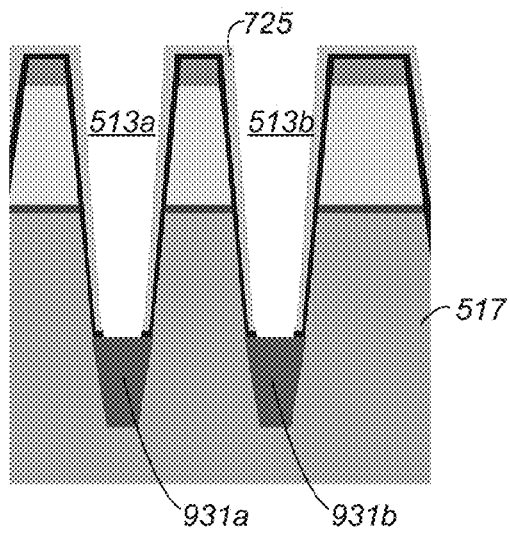
FIG. 9 illustrates filling of second trenches by an oxidation process.

FIG. 9 shows the results of an oxidation process in which silicon oxide (e.g. silicon dioxide, SiO2) is grown on exposed silicon surfaces of substrate 517. Because covering layer 725 overlies sides of first trenches 513*a-b*, no oxide grows along sides of first trenches. Oxide grows along surfaces of second trenches to form portions of oxide 931*a-b* that fill second trenches 829*a-b* respectively. Oxidation may be performed in any suitable manner, e.g. in a furnace with steam used to oxidize exposed silicon of substrate 517. It will be understood that silicon oxide grows on surfaces of silicon by providing oxygen to oxidize the exposed silicon (Si+O2→SiO2) and that where no silicon is exposed (e.g. first trenches) this does not occur. Oxidation may be self-limiting because the oxide layer limits diffusion of oxygen to react and form additional oxide. An oxidation step may be timed to end when the second trenches are filled with oxide (e.g. based on measurement of dimensions of the second trench). For example, 40 minutes in a furnace may grow about five nanometers (5 nm) of oxide which may be sufficient to fill a second trench.

Figure 10:
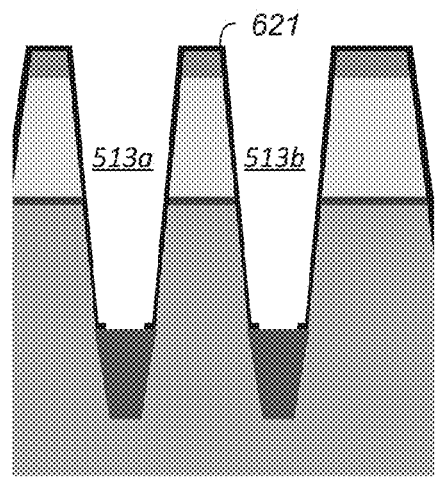
FIG. 10 illustrates removal of the silicon nitride layer.
Figure 11:
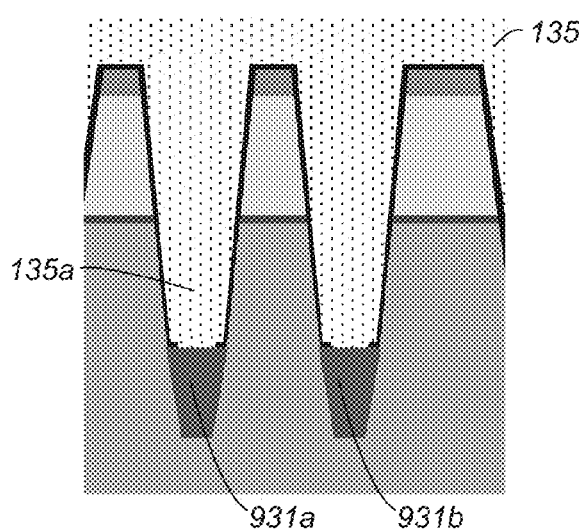
FIG. 11 illustrates filling of first trenches by a deposition process.

FIG. 10 shows the structure of FIG. 9 after removal of cover layer 725 to expose liner layer 621. A suitable selective etch may be used to remove cover layer 725 without significantly removing material of liner layer 621 or other materials. For example, phosphoric acid (H3PO4) may selectively remove a cover layer formed of silicon nitride without significantly etching an underlying liner layer of silicon oxide. Cover layer 725 is no longer needed at this point its removal may allow better filling of first trenches FIG. 11 shows the structure of FIG. 10 after deposition of deposited dielectric 135 (e.g. PSZ) to fill first trenches 513*a-b*. Deposited dielectric 135 may be deposited by any suitable technique. For example, PSZ may be deposited in a solution (e.g. in an organic solvent) by spinning-on, spraying, rolling, dipping or otherwise coating a surface of a substrate with the solution and subsequently curing, baking, drying, or otherwise treating the coated substrate. Other deposited dielectric materials may be deposited in some other suitable manner, e.g. Chemical Vapor Deposition (CVD), Physical Vapor Deposition (PVD), Atomic Layer Deposition (ALD), Molecular Beam Epitaxy (MBE), or other deposition technique. Because second trenches were previously filled, only first trenches 513*a-b* are filled in this step and first trenches have an aspect ratio b/a that allows void free filling with dielectric material. Thus, the resulting structure includes first trenches filled with PSZ (void free) and second trenches filled with silicon oxide (void free). These two trenches have a combined aspect ratio that may be too high to allow void free filling with PSZ alone. The resulting isolating structure has a lower isolating portion (e.g. portion 931*a*) formed of silicon dioxide and an upper isolating portion (e.g. portion 135*a*) formed of PSZ, which in combination provide a deep isolation structure that provides a high level of isolation between NAND strings.

Figure 12:
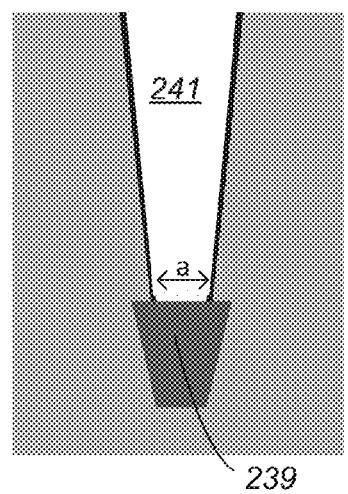
FIG. 12 illustrates widening of second trenches during oxidation.

It will be understood that variations of the process steps of the above example may be used to achieve different results. For example, different trench profiles may be achieved by using different etching schemes. FIG. 12 shows an example of a portion of silicon oxide 239 that is wider than the bottom of the first trench 241 (i.e. wider than the distance, a, between sidewalls of the first trench at the bottom of the first trench). In general, because the silicon dioxide in the second trench is formed by growing on the silicon surfaces of the second trench, and this growth consumes silicon, the silicon dioxide portion expands beyond the dimensions of the second trench prior to oxidation. As silicon is consumed, the second trench grows and may be wider than the opening at the bottom of the first trench (i.e. wider than dimension a).

Figure 13:
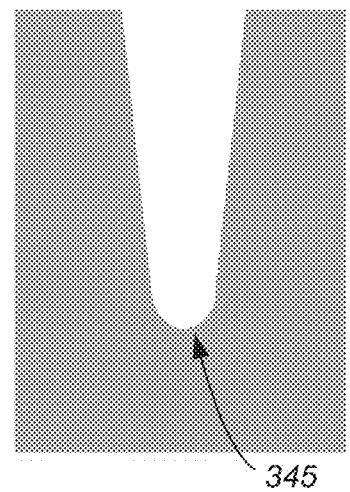
FIG. 13 illustrates an alternative shape for first trenches.

FIG. 13 shows an alternative example in which first trenches are formed with a concave lower surface 345. When such a trench is exposed to anisotropic etching, the opening formed in the cover layer tends to be narrower than the bottom of the first trench because etching proceeds more quickly at the center of the bottom where a cover layer has the smallest vertical dimension. The etch profile of the second trench tends to be pointed as a result of faster etching at the center of the concave surface and slower etching further out from the center.

Figure 14:
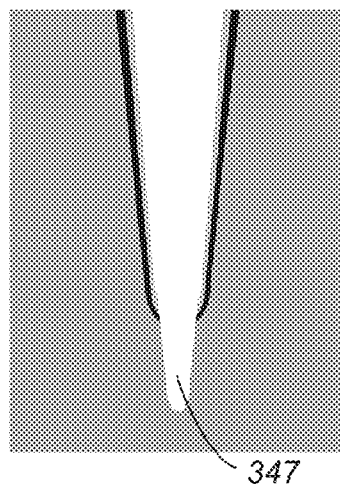
FIG. 14 illustrates an alternative shape for second trenches.
Figure 15:
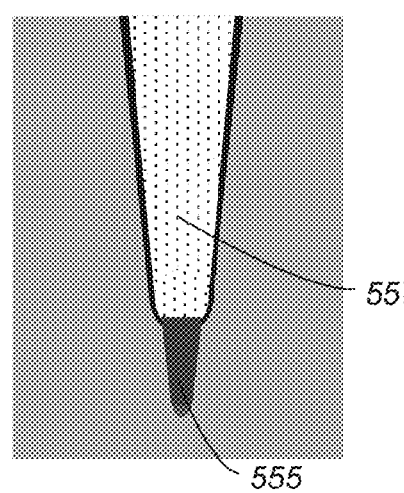
FIG. 15 illustrates oxidation of second trenches and filling of first trenches of FIG. 14.

FIG. 14 shows an example of a profile of a second trench 347 formed by anisotropic etching of the structure of FIG. 13 (after deposition of liner and cover layers). FIG. 15 shows the structure of FIG. 14 after filling of the second trench 347 to form silicon oxide portion 555 and filling of the first trench to form PSZ portion 557. In some cases, a pointed profile such as shown in FIG. 15 may provide a concentrated electric field so that a profile such as shown in FIG. 12 may be selected. In general, different trench profiles may be generated by tuning an etch process to achieve the desired profile.

Figure 16:
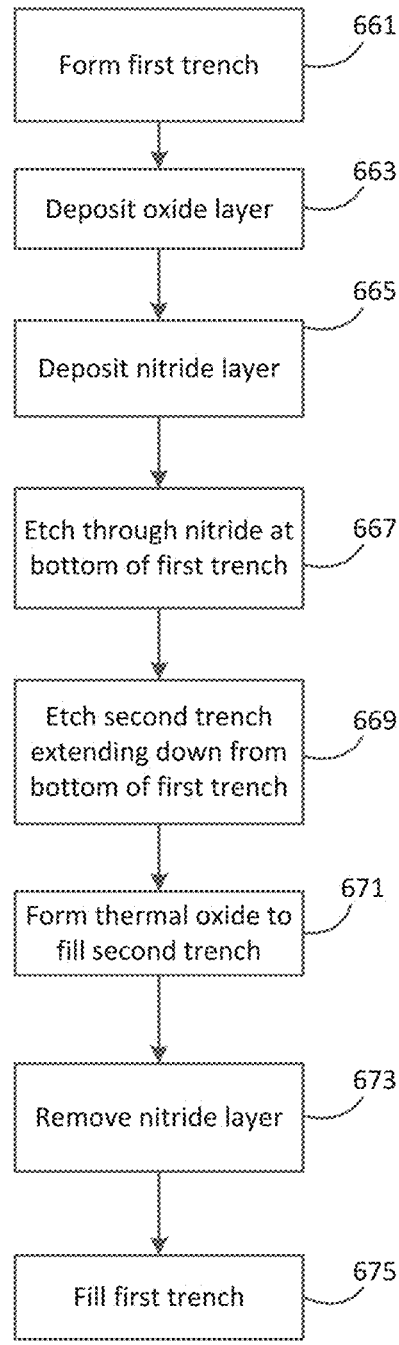
FIG. 16 illustrates an example of steps used to form double trenches for isolation.

FIG. 16 shows an example of process steps used to provide isolation structures between NAND strings. A first trench is formed 661 to separate floating gates and extend into the silicon substrate. Then, an (optional) oxide liner layer is deposited 663 on surfaces of the first trench and a nitride cover layer is deposited 665 over the liner layer. Anisotropic etching (e.g. RIE) is used to etch through the nitride cover layer 667 and the oxide liner layer to expose the bottom of the first trench. Anisotropic etching is used to etch a second trench that extends down from the bottom surface of the first trench 669. An oxidation step forms thermal oxide on exposed surfaces of the second trench to fill the second trench with silicon oxide 671. The nitride cover layer is then selectively removed 673 and the first trench is filled with deposited PSZ 675.

CONCLUSION

Although the various aspects have been described with respect to particular examples, it will be understood that protection within the full scope of the appended claims is appropriate. Furthermore, although the present description teaches methods for implementation with respect to particular prior art structures, it will be understood that the present claims are entitled to protection when implemented in memory arrays with architectures other than those described.

It is claimed:

1. An isolating structure in a nonvolatile memory comprising:
   a first trench having sidewalls that extend into a silicon substrate between active areas;
   a second trench that extends from the first trench further into the silicon substrate, the second trench including sidewalls and a bottom surface such that the sidewalls of the first and second trenches and the bottom surface define an inner surface;
   a liner layer extending over a portion of the inner surface, wherein there is an opening in the liner layer in a position that corresponds to the second trench;

a portion of polysilazane filling the first trench, wherein the portion of polysilazane is separated from sidewalls of the first trench by no more than the liner layer;

a portion of silicon dioxide filling the second trench, the portion of silicon dioxide lying in direct physical contact with the silicon substrate along the sidewalls of the second trench, the portion of silicon dioxide lying in direct physical contact with the portion of polysilazane filling the first trench.

2. The isolating structure of claim 1 wherein a combined aspect ratio of the first and second trenches is greater than approximately 4.

3. The isolating structure of claim 2 wherein the first trench has an aspect ratio that is less than seven.

4. The isolating structure of claim 1 wherein the liner layer comprises a silicon oxide layer that extends along the sidewalls of the first trench.

5. The isolating structure of claim 1 wherein the isolating structure provides isolation between NAND strings of a NAND flash memory array.

6. The isolating structure of claim 1 wherein the portion of polysilazane extends above a level of an upper surface of the silicon substrate between floating gates of the nonvolatile memory.

7. The isolating structure of claim 2 wherein the combined aspect ratio is greater than 7.

8. The isolating structure of claim 2 wherein the first trench has an aspect ratio that is less than four.

9. The isolating structure of claim 1, wherein a width of the portion of silicon dioxide at an interface of the first trench and the second trench is greater than a width of the portion of polysilazane at the interface.

10. The isolating structure of claim 1, wherein a maximum width of the second trench is less than a distance between the sidewalls of the first trench.

* * * * *